United States Patent
Danen et al.

(10) Patent No.: US 11,921,052 B2
(45) Date of Patent: Mar. 5, 2024

(54) INSPECTION WITH PREVIOUS STEP SUBTRACTION

(71) Applicant: KLA Corporation, Milpitas, CA (US)

(72) Inventors: Robert M. Danen, San Jose, CA (US); Sangbong Park, Milpitas, CA (US); Dmitri Starodub, Milpitas, CA (US); Abdurrahman Sezginer, Monte Sereno, CA (US)

(73) Assignee: KLA Corporation, Milpitas, CA (US)

( * ) Notice: Subject to any disclaimer, the term of this patent is extended or adjusted under 35 U.S.C. 154(b) by 0 days.

(21) Appl. No.: 18/128,203

(22) Filed: Mar. 29, 2023

(65) Prior Publication Data

US 2023/0316478 A1 Oct. 5, 2023

Related U.S. Application Data

(60) Provisional application No. 63/326,268, filed on Mar. 31, 2022.

(51) Int. Cl.
  *G01N 21/88* (2006.01)
  *G06T 5/00* (2006.01)
  (Continued)

(52) U.S. Cl.
  CPC ........ *G01N 21/8851* (2013.01); *G06T 5/002* (2013.01); *G06T 5/50* (2013.01);
  (Continued)

(58) Field of Classification Search
  CPC ........ G01N 21/8851; G01N 2021/8887; G06T 5/002; G06T 5/50; G06T 7/001;
  (Continued)

(56) References Cited

U.S. PATENT DOCUMENTS

| 7,877,722 B2 | 1/2011 | Duffy et al. |
| 8,126,255 B2 | 2/2012 | Bhaskar et al. |
| (Continued) | | |

FOREIGN PATENT DOCUMENTS

| JP | 2004327950 A | 11/2004 |
| JP | 4789630 B2 | 10/2011 |
| (Continued) | | |

OTHER PUBLICATIONS

Hiroi et al. ("Robust Defect Detection System Using Double Reference Image Averaging for High Throughput SEM Inspection Tool," The 17th Annual SEMI/IEEE ASMC 2006 Conference; Date of Conference: May 22-24, 2006) (Year: 2006).*
(Continued)

*Primary Examiner* — Yubin Hung
(74) *Attorney, Agent, or Firm* — Suiter Swantz pc llo (57) ABSTRACT

An inspection system may generate first-step images of multiple sample regions after a first process step and generate second-step images of the sample regions after a second process step, where the second process step modifies the sample in at least one of the sample regions. The system may further identify one of the sample regions as a test region and at least some of the remaining sample regions as comparison regions, where the second-step image of the test region is a test image and the second-step images of the comparison regions are comparison images. The system may further generate a multi-step difference image by subtracting a combination of at least one of the second-step comparison images and at least two of the first-step images from the test image. The system may further identify defects in the test region associated with the second process step based on the multi-step difference image.

38 Claims, 5 Drawing Sheets

(51) Int. Cl.
  *G06T 5/50* (2006.01)
  *G06T 7/00* (2017.01)
  *H01L 21/66* (2006.01)
(52) U.S. Cl.
  CPC ...... *G06T 7/001* (2013.01); *G01N 2021/8887* (2013.01); *G06T 2207/10024* (2013.01); *G06T 2207/10152* (2013.01); *G06T 2207/20081* (2013.01); *G06T 2207/20224* (2013.01); *G06T 2207/30148* (2013.01); *H01L 22/12* (2013.01)
(58) Field of Classification Search
  CPC . G06T 2207/10024; G06T 2207/10152; G06T 2207/20081; G06T 2207/20224; G06T 2207/30148; H01L 22/12
  See application file for complete search history.

(56) References Cited

U.S. PATENT DOCUMENTS

| | | | |
|---|---|---|---|
| 8,611,639 | B2 | 12/2013 | Kulkarni et al. |
| 9,183,624 | B2 | 11/2015 | Karsenti et al. |
| 9,262,821 | B2 | 2/2016 | Shifrin et al. |
| 9,518,934 | B2 | 12/2016 | Chen et al. |
| 9,613,411 | B2 | 4/2017 | Konuru et al. |
| 9,619,876 | B2 | 4/2017 | Huang et al. |
| 10,346,740 | B2 | 7/2019 | Zhang et al. |
| 10,395,358 | B2 | 8/2019 | Brauer et al. |
| 10,504,213 | B2 | 12/2019 | Brauer |
| 10,533,848 | B2 | 1/2020 | Shchegrov et al. |
| 10,535,131 | B2 | 1/2020 | Maher et al. |
| 10,557,802 | B2 | 2/2020 | Brauer et al. |
| 10,599,944 | B2 | 3/2020 | Lee et al. |
| 10,801,968 | B2 | 10/2020 | Brauer |
| 10,923,317 | B2 | 2/2021 | Huang et al. |
| 10,943,838 | B2 | 3/2021 | Hoo et al. |
| 11,010,885 | B2 | 5/2021 | Brauer et al. |
| 11,120,546 | B2 | 9/2021 | Brauer et al. |
| 11,270,430 | B2 | 3/2022 | Sezginer et al. |
| 11,415,526 | B2 | 8/2022 | Duffy et al. |
| 11,415,531 | B2 | 8/2022 | Gaind et al. |
| 11,416,982 | B2 | 8/2022 | Brauer et al. |
| 11,494,924 | B2 | 11/2022 | Noormofidi et al. |
| 11,550,309 | B2 | 1/2023 | Soltanmohammadi et al. |
| 11,551,348 | B2 | 1/2023 | Zhang et al. |
| 2003/0012442 | A1 | 1/2003 | Hashimoto et al. |
| 2004/0196453 | A1 | 10/2004 | Some |
| 2008/0165345 | A1 | 7/2008 | Hill |
| 2008/0291454 | A1 | 11/2008 | Cai et al. |
| 2009/0080759 | A1 | 3/2009 | Bhaskar et al. |
| 2010/0329540 | A1 | 12/2010 | Bhaskar et al. |
| 2012/0308112 | A1 | 12/2012 | Hu et al. |
| 2015/0006103 | A1 | 1/2015 | Wel et al. |
| 2017/0116727 | A1* | 4/2017 | Kim .................. G02B 27/0988 |
| 2018/0082415 | A1* | 3/2018 | Sezginer ................. G06T 7/001 |
| 2018/0144442 | A1 | 5/2018 | Brauer |
| 2019/0033728 | A1 | 1/2019 | Takagi et al. |
| 2019/0122913 | A1 | 4/2019 | Lauber et al. |
| 2019/0287232 | A1 | 9/2019 | Brauer |
| 2020/0025689 | A1 | 1/2020 | Gaind et al. |
| 2020/0193588 | A1 | 6/2020 | Brauer et al. |
| 2021/0010945 | A1 | 1/2021 | Brauer et al. |
| 2021/0109041 | A1 | 4/2021 | Gaind et al. |
| 2021/0366103 | A1* | 11/2021 | Zhang .................... G06N 3/082 |
| 2021/0381989 | A1* | 12/2021 | Hiroi ................ G01N 21/95684 |
| 2022/0050061 | A1 | 2/2022 | Bar |

FOREIGN PATENT DOCUMENTS

| | | | | |
|---|---|---|---|---|
| KR | 1020080028278 A | 3/2008 | | |
| KR | 1020170100710 A | 9/2017 | | |
| WO | WO-2013134068 A1 | * | 9/2013 | ......... G01N 21/8806 |
| WO | WO-2019167151 A1 | * | 9/2019 | ............ G01N 21/47 |
| WO | 2020035285 A1 | 2/2020 | | |

OTHER PUBLICATIONS

Kim et al. ("Improved Non-parametric Subtraction for Detection of Wafer Defect," 5th International Symposium on Image and Signal Processing and Analysis; Date of Conference: Sep. 27-29, 2007) (Year: 2007).*

Amano, "Defect Detection starter (U-Net), Severstal: Steel Defect Detection", Aug. 3, 2019, 25 pages.

Kälber et al., "U-Net based Zero-hour Defect Inspection of Electronic Components andSemiconductors," VISAPP 2021—16th International Conference on Computer Vision Theory and Applications, 2021, 9 pages, SCITEPRESS—Science and Technology Publications, Lda.

Khanmohammadi et al., "A Gaussian mixture model based discretization algorithm for associative classification of medical data," Expert Systems With Applications, Apr. 8, 2016, 11 pages, Elsevier Ltd.

Ren et al., "A Generic Deep-Learning-Based Approach for Automated Surface Inspection," IEEE Transactions on Cybernetics, 12 pages, vol. 48, No. 3, Mar. 2018, IEEE.

Ronneberger et al., "U-Net: Convolutional Networks for Biomedical Image Segmentation," May 18, 2015, 8 pages, Computer Science Department and BIOSS Centre for Biological Signalling Studies, University of Freiburg, Germany.

Salimans et al., "PIXELCNN++: Improving the PIXELCNN With Discretized Logistic Mixture Likelihood and Other Modifications," Conference Paper at ICLR 2017, Jan. 19, 2017, 10 pages.

Van Den Oord et al., "Conditional Image Generation with PixelCNN Decoders," Jun. 18, 2016, 13 pages.

Yamashita et al., "Convolutional neural networks: an overview and application in radiology," Insights into Imaging, Jun. 22, 2018, 19 pages, Springer Nature.

Yun et al., "Automated defect inspection system for metal surfaces based on deep learning and data augmentation," Journal of Manufacturing Systems, May 15, 2020, 8 pages, No. 55, Elsevier Ltd.

Zheng et al., "Recent advances in surface defect inspection of industrial products using deep learning techniques," Survey Paper, The International Journal of Advanced Manufacturing Technology, Jan. 25, 2021, 24 pages, Springer-Verlag London Ltd., part of Springer Nature 2021.

Korean Intellectual Property Office, International Search Report and Written Opinion for International Application No. PCT/US2023/017008, dated Jul. 31, 2023, 6 pages.

Korean Intellectual Property Office, International Search Report and Written Opinion for International Application No. PCT/US2023/017001, dated Jul. 24, 2023, 9 pages.

Korean Intellectual Property Office, International Search Report and Written Opinion for International Application No. PCT/US2023/017004, dated Jul. 12, 2023, 9 pages.

Korean Intellectual Property Office, International Search Report and Written Opinion for International Application No. PCT/US2023/017007, dated Jul. 11, 2023, 7 pages.

* cited by examiner

INSPECTION WITH PREVIOUS STEP SUBTRACTION

CROSS-REFERENCE TO RELATED APPLICATION

The present application claims the benefit under 35 U.S.C. § 119(e) of U.S. Provisional Application Ser. No. 63/326,268, filed Mar. 31, 2022, which is incorporated herein by reference in the entirety.

TECHNICAL FIELD

The present disclosure relates generally to defect inspection and, more particularly, to compensating for noise during defect inspection for a current process step using an image associated with a previous process step.

BACKGROUND

Inspection systems are typically used in semiconductor fabrication processes to identify defects of the fabrication process that may result in performance degradation or failure of a fabricated device. As fabricated feature sizes continue to shrink, the sizes of fabrication defects also shrink. This results in weaker measurable signals associated with such defects and lower signal to noise ratios (SNRs) during defect inspection. There is therefore a need to develop systems and methods to address the above deficiencies.

SUMMARY

An inspection system is disclosed in accordance with one or more illustrative embodiments. In one illustrative embodiment, the system includes a controller to receive first-step images of a plurality of sample regions after a first process step and receive second-step images of the plurality of sample regions after a second process step, where the second process step modifies the sample in at least one of the plurality of sample regions. In another illustrative embodiment, the controller further identifies one of the plurality of sample regions as a test region and at least some of the remaining sample regions as comparison regions, where the second-step image of the test region is a test image and the second-step images of the comparison regions are comparison images. In another illustrative embodiment, the controller generates a multi-step difference image by a weighted subtraction of a combination of at least one of the second-step comparison images and at least two of the first-step images from the test image. In another illustrative embodiment, the controller identifies defects in the test region associated with the second process step based on the multi-step difference image.

An inspection method is disclosed in accordance with one or more illustrative embodiments. In one illustrative embodiment, the method includes generating first-step images of a plurality of sample regions after a first process step. In another illustrative embodiment, the method includes generating second-step images of the plurality of sample regions after a second process step, where the second process step modifies the sample in at least one of the plurality of sample regions. In another illustrative embodiment, the method includes identifying one of the plurality of sample regions as a test region and at least some of the remaining sample regions as comparison regions, where the second-step image of the test region is a test image and the second-step images of the comparison regions are comparison images. In another illustrative embodiment, the method includes generating a multi-step difference image by weighted subtraction of a combination of at least one of the second-step comparison images and at least two of the first-step images from the test image. In another illustrative embodiment, the method includes identifying defects in the test region associated with the second process step based on the multi-step difference image.

An inspection system is disclosed, in accordance with one or more illustrative embodiments. In one illustrative embodiment, the system includes an imaging sub-system including an illumination source and a detector configured to image a sample. In another illustrative embodiment, the system includes a controller. In another illustrative embodiment, the controller receives first-step images of a plurality of sample regions after a first process step from the imaging sub-system. In another illustrative embodiment, the controller receives second-step images of the plurality of sample regions after a second process step, where the second process step modifies the sample in at least one of the plurality of sample regions from the imaging sub-system. In another illustrative embodiment, the controller identifies one of the plurality of sample regions as a test region and at least some of the remaining sample regions as comparison regions, where the second-step image of the test region is a test image and the second-step images of the comparison regions are comparison images. In another illustrative embodiment, the controller generates a multi-step difference image by weighted subtraction of a combination of at least one of the second-step comparison images and at least two of the first-step images from the test image. In another illustrative embodiment, the controller identifies defects in the test region associated with the second process step based on the multi-step difference image.

It is to be understood that both the foregoing general description and the following detailed description are exemplary and explanatory only and are not necessarily restrictive of the invention as claimed. The accompanying drawings, which are incorporated in and constitute a part of the specification, illustrate embodiments of the invention and together with the general description, serve to explain the principles of the invention.

BRIEF DESCRIPTION OF DRAWINGS

The numerous advantages of the disclosure may be better understood by those skilled in the art by reference to the accompanying figures.

DETAILED DESCRIPTION

Reference will now be made in detail to the subject matter disclosed, which is illustrated in the accompanying drawings. The present disclosure has been particularly shown and described with respect to certain embodiments and specific features thereof. The embodiments set forth herein are taken to be illustrative rather than limiting. It should be readily apparent to those of ordinary skill in the art that various changes and modifications in form and detail may be made without departing from the spirit and scope of the disclosure.

Embodiments of the present disclosure are directed to systems and methods for defect inspection at a current process step in which a difference image representative of noise associated with a previous process step is subtracted from a corresponding difference image at the current process step. In this way, the noise of an image to be analyzed for defects (referred to herein as an inspection difference image) and may have a high signal to noise ratio (SNR).

Semiconductor devices are typically fabricated using a series of process steps such as, but not limited to, deposition of process layers and/or photoresists, photoresist exposure with a desired pattern, etching of the photoresist and/or underlying process layers, polishing, or the like. Variations of any of these processes, alone or in combination, may lead to variations of fabricated sample features. In a general sense, some sample variations may be acceptable and are deemed nuisances, while others may result in unacceptable performance degradation or device failure and are deemed defects of interest (DOIs).

Inspection tools may be used to inspect a sample for defects after selected process steps. For example, an inspection tool may generate an image of a sample region of interest (e.g., a die, a cell, or the like) after a particular process step of interest, which is referred to herein as a test image. An inspection tool may then identify defects in this sample region by comparing this test image to a reference image. As an illustration, a difference image may be generated based on subtracting the reference image from the test image (or vice versa) to generate a difference image, where features in the difference image correspond to sample variations. These sample variations may then be classified as DOIs or nuisances. Such reference images may be generated based on additional sample regions (e.g., additional dies, cells, or the like on the same or a different sample) having a common design and/or design data. The generation of difference images is generally described in U.S. Pat. No. 11,270,430 issued on Mar. 8, 2022, which is incorporated herein by reference in its entirety.

Such test and reference images associated with any particular process step may be generated using any suitable technique and may correspond to independently-generated images or portions of one or more larger images (e.g., may correspond to sub-images of one or more larger images). As an illustration, a test image may be associated with a portion of a larger image representative of multiple dies on the sample. In this way, the test image may be a sub-image representative of a region of interest that is being inspected for defects at a particular time (e.g., a particular die). As another illustration, a reference image may be generated based on one or more different portions of the larger image associated with different regions on the sample (e.g., additional dies). For example, a reference image may correspond to an average of sub-images associated with one or more additional dies on the sample. In this configuration, a difference image at a particular process step may correspond to a difference between the inspection sub-image image and the reference image (e.g., a combination of sub-images).

Further, the definitions of a test image or a reference image may depend on the particular region of interest and may change over time. For example, an image of a particular die may be used as a test image when identifying defects on that particular die and may be used as a reference image (or used as one of several images combined to form a reference image) when identifying defects on a different die.

Various types of inspection tools have been developed including optical inspection tools that generate an image based on illumination with a light source or particle-beam inspection tools that generate an image based on illumination with a particle beam (e.g., electron beam (e-beam), ion beam, or the like). Optical inspection tools are commonly used for in-line inspection due to the relatively high throughput. Further, many inspection tools generate images by scanning a beam (e.g., a light beam or a particle beam) across the sample in multiple swaths and building up an image of the sample in whole or part based on the swaths.

Various conditions may decrease the signal to noise ratio (SNR) of defect signals during inspection and thus limit the accuracy or reliability. For example, as the size of fabricated device features shrinks, the size of associated process defects that result in degraded performance or device failure also shrinks. This results in reduced SNR as the feature and/or defect size approaches the resolution limit of an inspection device under even ideal conditions. Further, the various process layers and/or photoresist layers on a sample are typically at least partially transparent to an inspection tool, particularly for optical inspection tools. Put another way, the inspection tool may typically image at least partially into the volume of the sample. This transparency may be beneficial for detecting sub-surface defects.

However, it is contemplated herein that signals from fabricated features associated with previous process steps may contribute to noise or nuisance signals during inspection of a current process step. For example, an optical inspection tool may be configured to provide a shallow depth of field in which features associated with a current process step under inspection are in focus and have relatively high contrast, whereas features associated with any number of previous focus steps may be blurred and may be considered noise or nuisance signals in a test image. The presence of such signals may further limit the SNR associated with small and/or weak defects and thus limit the accuracy and/or reliability of inspection.

In some embodiments, inspection SNR is increased by performing defect inspection on a multi-step difference image, where the multi-step difference image is generated based on subtracting reference images associated with both current and previous layers from a test image. In this context, the term reference image is used to describe any image (or portion thereof) associated with a different region than the one considered a test image at a particular time.

It is contemplated herein that a multi-step difference image may be constructed in different ways within the spirit and scope of the present disclosure. In some embodiments, a multi-step difference image is formed by subtracting, from a test image associated with a region of interest (e.g., a die) at a current process step, multiple images of other regions at both the current process step and a previous process step. In some embodiments, a multi-step difference image is formed by subtracting, from a test image associated with a region of interest (e.g., a die) at a current process step, a weighted difference of images of other regions at both the current process step and a previous process step. In this configuration, the weights may be determined by an optimization algorithm (e.g., designed to minimize the pixel values of the multi-step difference image.

It is further contemplated herein that the systems and methods disclosed herein may more effectively reduce image noise and improve detection sensitivity than previous techniques utilizing data from previous process layers. For example, wafer noise reduction by image subtraction across layers is generally described in U.S. Pat. No. 10,504,213 issued on Dec. 10, 2019, which is incorporated herein by reference in its entirety.

It is contemplated herein that the systems and methods disclosed herein may be particularly advantageous for, but are not limited to, applications in which the impact of a current process step is a relatively mild optical perturbation as measured by the inspection tool. Put another way, the systems and method disclosed herein may be particularly advantageous for, but are not limited to, applications in which test images (e.g., a raw test image) at current and previous steps are relatively unchanged except for fabricated features of interest. For example, the systems and methods disclosed herein may be particularly advantageous for, but are not limited to, inspection of vias, mask etching (e.g., hard mask etching), punch defects, hole features, line features, scratches, pits, or residual materials.

Some embodiments of the present disclosure are directed to methods for defect inspection based on subtracting noise associated with previous layer features. Some embodiments of the present disclosure are directed to inspection systems configured to perform defect inspection based on subtracting noise associated with previous layer features.

Some embodiments of the present disclosure are directed to an inspection recipe for defect inspection based on subtracting noise associated with previous layer features. For example, an inspection recipe may define various parameters associated with imaging a sample and/or process steps associated with identifying defects on the sample based on one or more images.

Referring now to FIGS. 1A-4, systems and methods for defect inspection are described in greater detail, in accordance with one or more embodiments of the present disclosure.

Figure 1A:
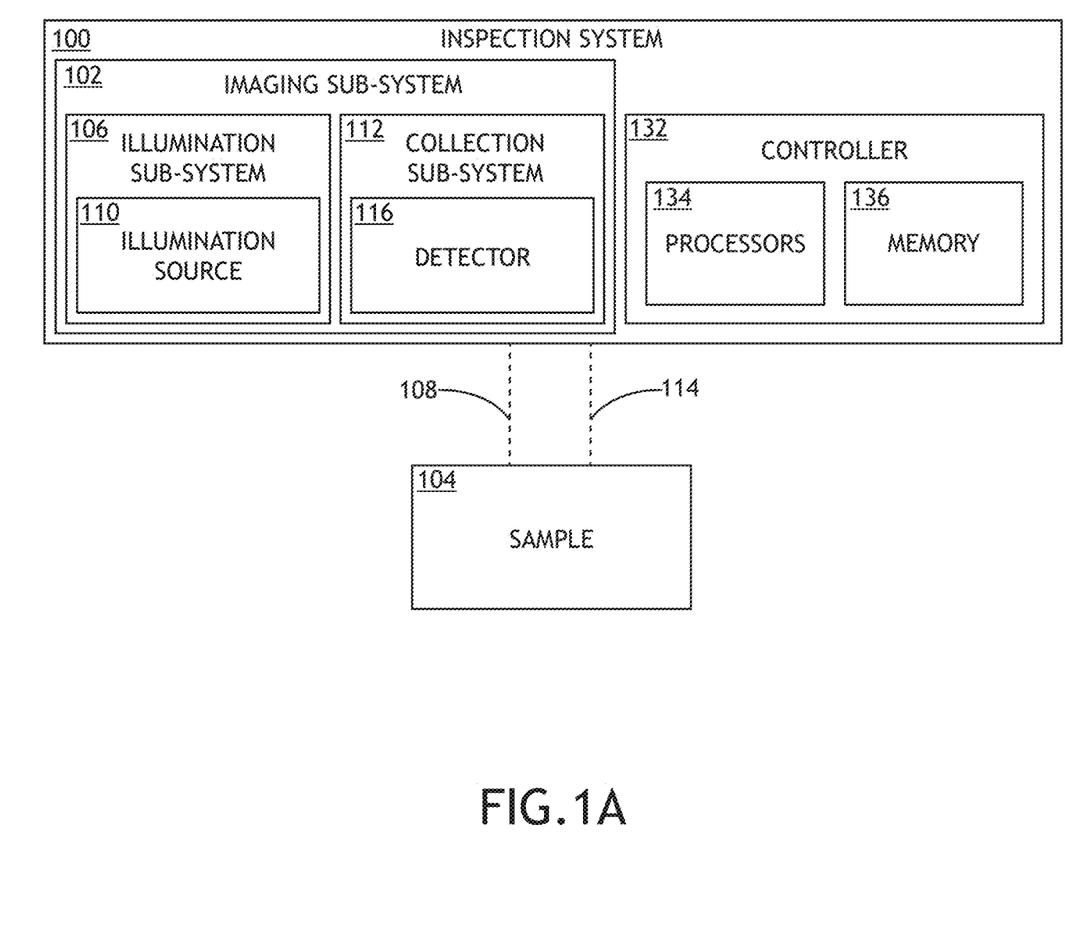
FIG. 1A is a block diagram of an inspection system, in accordance with one or more embodiments of the present disclosure.

FIG. 1A is a block diagram of an inspection system 100, in accordance with one or more embodiments of the present disclosure.

In one embodiment, the inspection system 100 includes an imaging sub-system 102 configured to generate one or more images of a sample 104. For example, the imaging sub-system 102 may include an illumination sub-system 106 configured to illuminate the sample 104 with illumination 108 (e.g., an illumination beam) from an illumination source 110 and a collection sub-system 112 configured to generate an image of the sample 104 using radiation emanating from the sample (e.g., sample radiation 114) using a detector 116.

In some embodiments, the sample 104 may include a substrate formed of a semiconductor or non-semiconductor material (e.g., a wafer, or the like). For example, a semiconductor or non-semiconductor material may include, but is not limited to, monocrystalline silicon, gallium arsenide, and indium phosphide. The sample 104 may further include one or more layers disposed on the substrate. For example, such layers may include, but are not limited to, a resist, a dielectric material, a conductive material, and/or a semiconductive material. Many different types of such layers are known in the art, and the term sample as used herein is intended to encompass a sample on which all types of such layers may be formed. One or more layers formed on a sample may be patterned or unpatterned. For example, a sample may include a plurality of dies, each having repeatable patterned features. Formation and processing of such layers of material may ultimately result in completed devices. Many different types of devices may be formed on a sample, and the term sample as used herein is intended to encompass a sample on which any type of device known in the art is being fabricated.

The imaging sub-system 102 may generate one or more images of the sample 104 using any technique known in the art. In some embodiments, the imaging sub-system 102 is an optical imaging sub-system 102, where the illumination source 110 is an optical source configured to generate illumination 108 in the form of light, and where the collection sub-system 112 images the sample 104 based on light emanating from the sample 104. In some embodiments, the imaging sub-system 102 is a particle imaging sub-system 102, where the illumination source 110 is a particle source configured to generate illumination 108 in the form of particles. For instance, particle illumination 108 may be in the form of an electron beam (e-beam), an ion beam (e.g., a focused ion beam), or a neutral-particle beam. Further, the collection sub-system 112 may image the sample 104 based on particles emanating from the sample 104 (e.g., backscattered electrons, or the like). In some cases, a particle inspection system 100 may also image the sample 104 based on light emanating from the sample 104 in response to the incident particle illumination 108 (e.g., based on photoluminescence, or the like).

Figure 1B:
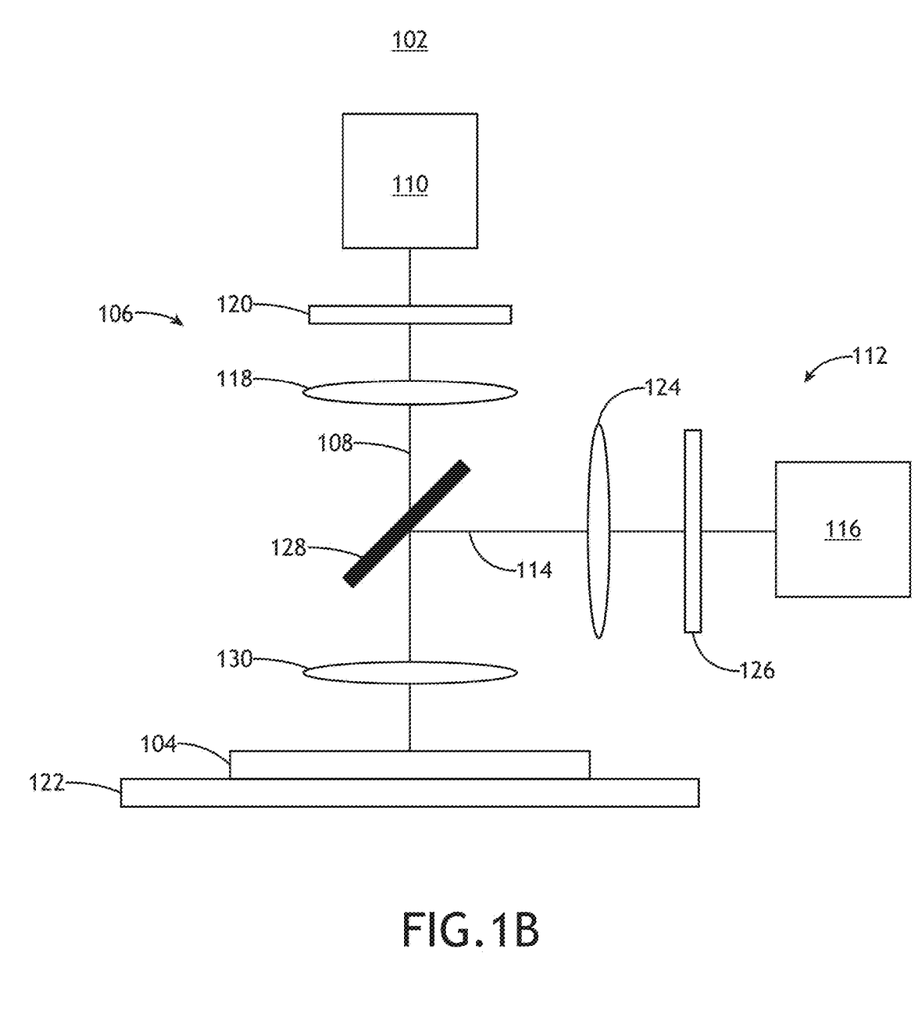
FIG. 1B is a simplified schematic view of an optical imaging sub-system, in accordance with one or more embodiments of the present disclosure.

FIG. 1B is a simplified schematic view of an optical imaging sub-system 102, in accordance with one or more embodiments of the present disclosure.

The illumination source 110 may include any type of illumination source known in the art suitable for generating an optical illumination 108, which may be in the form of one or more illumination beams. Further, the illumination 108 may have any spectrum such as, but not limited to, extreme ultraviolet (EUV) wavelengths, ultraviolet (UV) wavelengths, visible wavelengths, or infrared (IR) wavelengths. Further, the illumination source 110 may be a broadband source, a narrowband source, and/or a tunable source.

In some embodiments, the illumination source 110 includes a broadband plasma (BBP) illumination source. In this regard, the illumination 108 may include radiation emitted by a plasma. For example, a BBP illumination source 110 may include, but is not required to include, one or more pump sources (e.g., one or more lasers) configured to focus into the volume of a gas, causing energy to be absorbed by the gas in order to generate or sustain a plasma suitable for emitting radiation. Further, at least a portion of the plasma radiation may be utilized as the illumination 108.

In another embodiment, the illumination source 110 may include one or more lasers. For instance, the illumination source 110 may include any laser system known in the art capable of emitting radiation in the infrared, visible, or ultraviolet portions of the electromagnetic spectrum.

The illumination source 110 may further produce illumination 108 having any temporal profile. For example, the illumination source 110 may produce continuous-wave (CW) illumination 108, pulsed illumination 108, or modulated illumination 108. Additionally, the illumination 108 may be delivered from the illumination source 110 via free-space propagation or guided light (e.g., an optical fiber, a light pipe, or the like).

The illumination sub-system 106 may include various components to direct the illumination 108 to the sample 104 such as, but not limited to, lenses 118, mirrors, or the like.

Further, such components may be reflective elements or transmissive elements. In this way, the depiction of the lenses 118 in FIG. 1B as transmissive elements is merely illustrative and not limiting. The illumination sub-system 106 may further include one or more optical elements 120 to modify and/or condition light in the associated optical path such as, but not limited to, one or more polarizers, one or more filters, one or more beam splitters, one or more diffusers, one or more homogenizers, one or more apodizers, or one or more beam shapers.

In some embodiments, the inspection system 100 includes a translation stage 122 for securing and/or positioning the sample 104 during imaging. For example, the translation stage 122 may include any combination of linear actuators, rotational actuators, or angle actuators to position the sample 104 using any number of degrees of freedom.

The imaging sub-system 102 may include various components to collect at least a portion of the sample radiation 114 radiation emanating from the sample 104 (e.g., sample light in the case of an optical imaging sub-system 102) and direct at least a portion of the sample light to a detector 116 for generation of an image. An image generated by the inspection system 100 may be any type of image known in the art such as, but not limited to, a brightfield image, a darkfield image, a phase-contrast image, or the like.

The imaging sub-system 102 may include various components to direct the sample radiation 114 to the detector 116 such as, but not limited to, lenses 124, mirrors, or the like. Further, such components may be reflective elements or transmissive elements. In this way, the depiction of the lenses 118 in FIG. 1B as transmissive elements is merely illustrative and not limiting. The imaging sub-system 102 may further include one or more optical elements 126 to modify and/or condition light in the associated optical path such as, but not limited to, one or more polarizers, one or more filters, one or more beam splitters, one or more diffusers, one or more homogenizers, one or more apodizers, or one or more beam shapers.

The detector 116 may include any type of sensor known in the art suitable for measuring sample light. For example, a detector 116 may include a multi-pixel sensor such as, but not limited to, a charge-couple device (CCD), a complementary metal-oxide-semiconductor (CMOS) device, a line sensor, or a time-delay-integration (TDI) sensor. As another example, a detector 116 may include two or more single-pixel sensors such as, but not limited to, a photodiode, an avalanche photodiode, a photomultiplier tube, or a single-photon detector.

The illumination sub-system 106 and the imaging sub-system 102 may be configured in various ways within the spirit and scope of the present disclosure. In some embodiments, as illustrated in FIG. 1B, the inspection system 100 includes at least one beamsplitter 128 common to the optical paths of the illumination sub-system 106 and the imaging sub-system 102. In this way, the illumination sub-system 106 and the imaging sub-system 102 may both share a common objective lens 130 and may both utilize the full available pupil or Numerical Aperture (NA) provided by the objective lens 130. In some embodiments, though not shown, the illumination sub-system 106 and the imaging sub-system 102 may have separate optical paths without common elements.

The inspection system 100 may further image the sample 104 using any technique known in the art. In some embodiments, the inspection system 100 generates an image of the sample 104 in a scanning mode by focusing the illumination 108 onto the sample 104 as a spot or a line, capturing a point or line image, and scanning the sample 104 to build up a two-dimensional image. For example, the inspection system 100 may scan the illumination 108 across the sample 104 in various swaths that may be partially overlapping. In this configuration, scanning may be achieved by moving the sample 104 with respect to the illumination 108 (e.g., using the translation stage 122), by moving the illumination 108 with respect to the sample 104 (e.g., using actuatable mirrors, or the like), or a combination thereof. In some embodiments, the inspection system 100 generates an image of the sample 104 in a static mode by directing the illumination 108 to the sample 104 in a two-dimensional field of view and capturing a two-dimensional image directly with the detector 116.

In some embodiments, various alignment and/or stitching operations are performed on the data generated by the imaging sub-system 102 to form one or more images of the sample 104. As an example, in the case of a scanning system, data associated with multiple swaths or portions thereof may be aligned and/or stitched to form an image of the entire sample 104 or just a portion thereof. In this way, the term image is used herein to broadly describe any array of pixels representative of a portion of the sample 104 and is not intended to impart limitations associated with the imaging technique. An image may thus correspond to a full dataset provided by the imaging sub-system 102, may correspond to a sub-set of this data (e.g., a sub-image), or may correspond to multiple datasets that are stitched (and properly aligned).

As described previously herein, images of the sample 104 or portions thereof may be used in a variety of ways. For example, an image of the sample 104 corresponding to a particular region (e.g., a particular die, cell, or the like) may be used as a test image when identifying defects in this particular region and may be used as a reference image (or used to generate a reference image along with images of other regions) when identifying defects in other regions of the sample 104.

In some embodiments, the inspection system 100 includes a controller 132, which may be communicatively coupled with the imaging sub-system 102 or any components therein. The controller 132 may include one or more processors 134 configured to execute program instructions maintained on a memory 136 (e.g., a memory medium). In this regard, the one or more processors 134 of controller 132 may be configured to execute any of the various process steps described throughout the present disclosure. For example, the controller 132 may perform steps such as, but not limited to, developing and/or implementing an inspection recipe, receiving data from the imaging sub-system 102 associated with images of the sample 104 or portions thereof for any number of process steps, perform alignment and/or stitching operations, generating or identifying images associated with selected portions of the sample 104 as test images or reference images, generating difference images between inspection and reference images, identifying defects on a sample 104 based on any combination of inspection, reference, or difference images associated with any number of process steps, or classifying identified defects.

The one or more processors 134 of a controller 132 may include any processing element known in the art. In this sense, the one or more processors 134 may include any microprocessor-type device configured to execute algorithms and/or instructions. In one embodiment, the one or more processors 134 may consist of a desktop computer, mainframe computer system, workstation, image computer, parallel processor, or any other computer system (e.g., networked computer) configured to execute a program configured to operate the inspection system 100, as described throughout the present disclosure. It is further recognized that the term "processor" may be broadly defined to encompass any device having one or more processing elements, which execute program instructions from a non-transitory memory 136.

The memory 136 may include any storage medium known in the art suitable for storing program instructions executable by the associated one or more processors 134. For example, the memory 136 may include a non-transitory memory medium. By way of another example, the memory 136 may include, but is not limited to, a read-only memory, a random access memory, a magnetic or optical memory device (e.g., disk), a magnetic tape, a solid state drive and the like. It is further noted that memory 136 may be housed in a common controller housing with the one or more processors 134. In one embodiment, the memory 136 may be located remotely with respect to the physical location of the one or more processors 134 and controller 132. For instance, the one or more processors 134 of controller 132 may access a remote memory (e.g., server), accessible through a network (e.g., internet, intranet and the like). Therefore, the above description should not be interpreted as a limitation on the present invention but merely an illustration.

The inspection system 100 may further be configured according to an inspection recipe, which may be implemented during run-time (e.g., by the controller 132, the illumination sub-system 106, the imaging sub-system 102, or any other component). In some embodiments, an inspection recipe includes parameters for configuring the inspection system 100 to image the sample 104 such as, but not limited to, parameters for controlling the illumination 108 such as, but not limited to, wavelength, polarization, spot size, incidence angle, or a pattern of swaths used to generate an image. In some embodiments, an inspection recipe includes parameters for controlling a collection of the sample radiation 114 such as, but not limited wavelength, polarization, collection angle, or operational parameters of the detector 116. In some embodiments, an inspection recipe includes directions for imaging the sample 104 after selected process steps. In some embodiments, an inspection recipe includes various processing steps associated with identifying defects based on the images.

Figure 2:
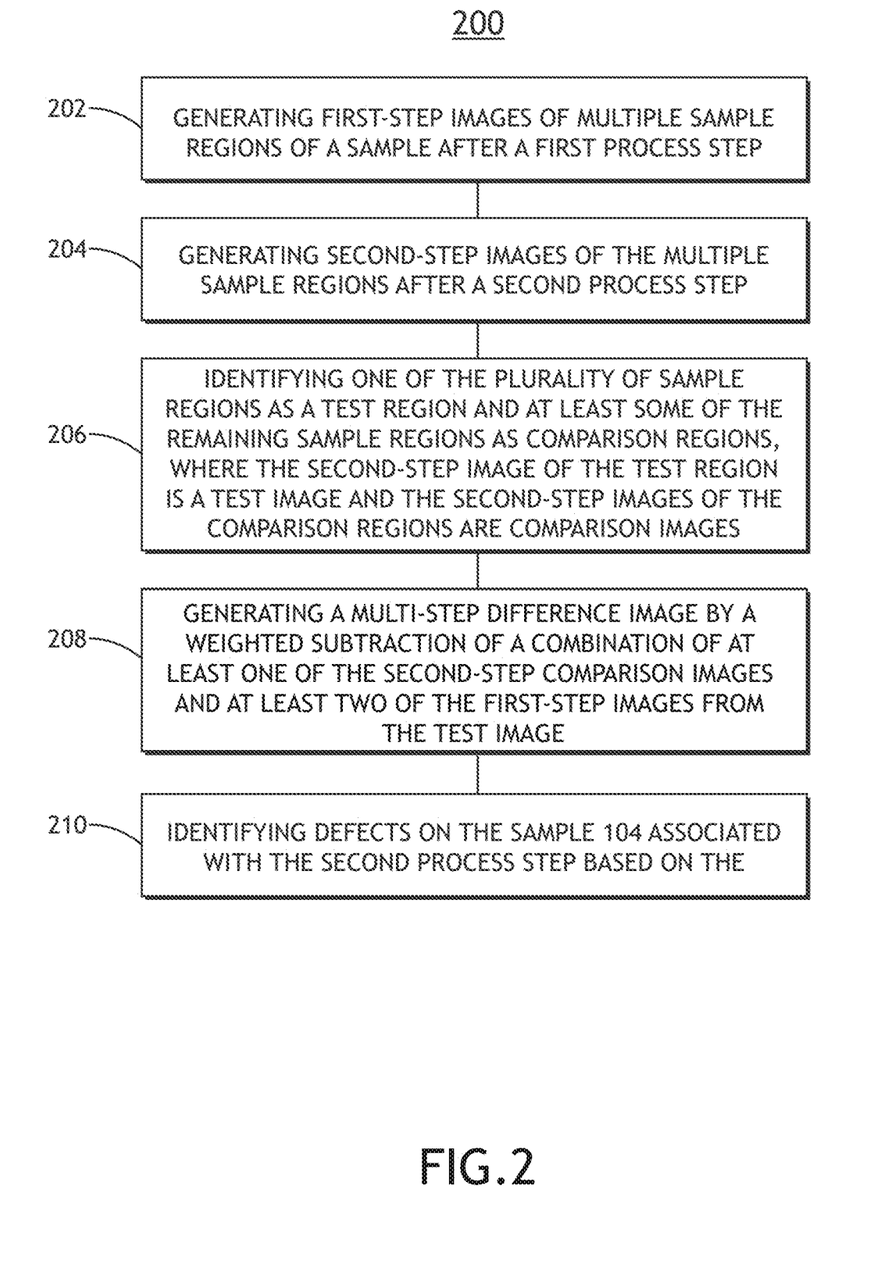
FIG. 2 is a flow diagram illustrating steps performed in an inspection method, in accordance with one or more embodiments of the present disclosure.
Figure 3:
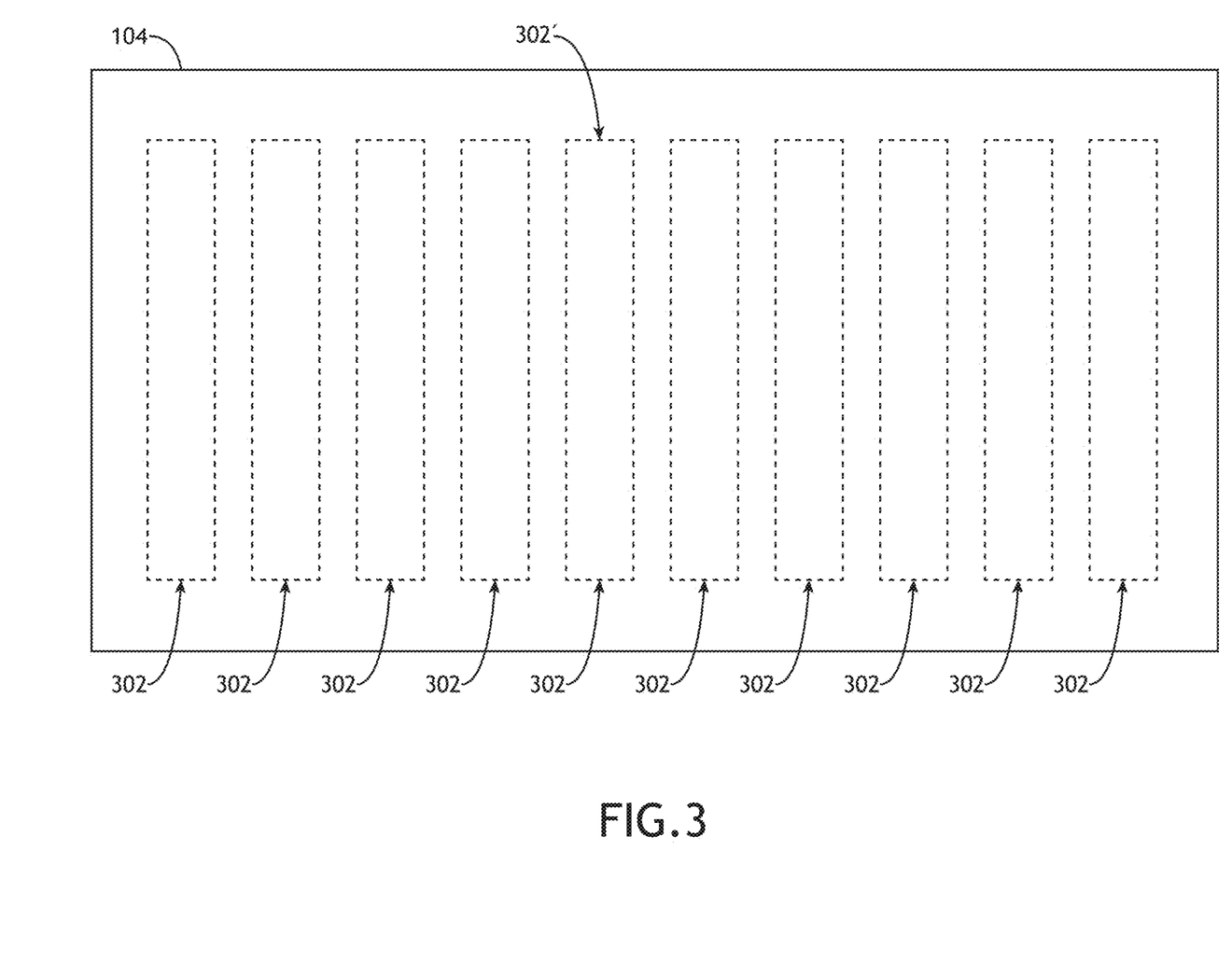
FIG. 3 is a simplified schematic of a portion of a sample depicting a series of sample regions that may be inspected for defects, in accordance with one or more embodiments of the present disclosure.
Figure 4:
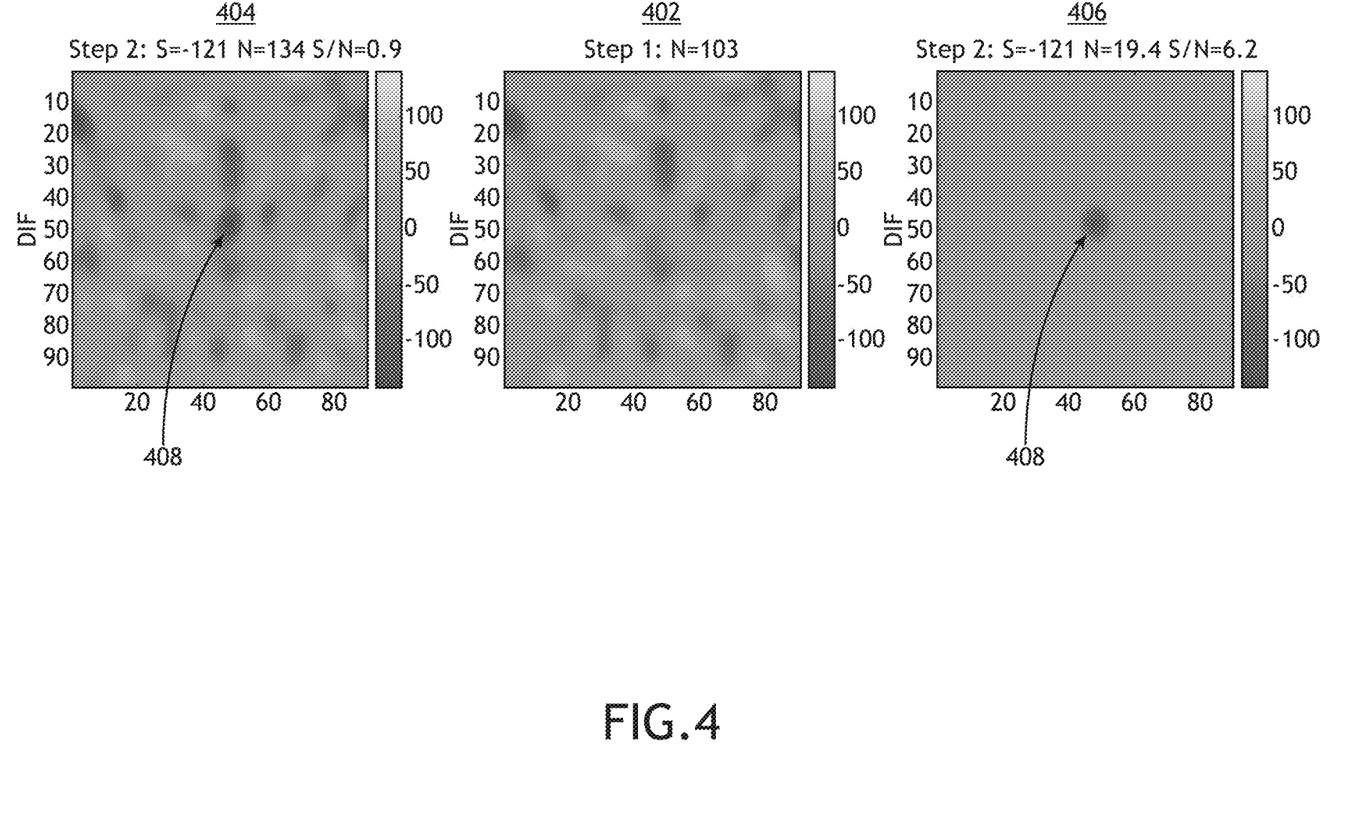
FIG. 4 is a flow diagram depicting simulated images of a sample associated with various steps of the method of FIG. 2, in accordance with one or more embodiments of the present disclosure.

Referring now to FIGS. 2-4, defect inspection based on subtraction of signals from previous process steps is described in greater detail, in accordance with one or more embodiments of the present disclosure.

FIG. 2 is a flow diagram illustrating steps performed in an inspection method 200, in accordance with one or more embodiments of the present disclosure. Applicant notes that the embodiments and enabling technologies described previously herein in the context of the inspection system 100 should be interpreted to extend to the method 200. For example, the controller 132 may be configured to It is further noted, however, that the method 200 is not limited to the architecture of the inspection system 100. In some embodiments, the method 200 or steps thereof are part of an inspection recipe (e.g., for an inspection system 100).

FIG. 2 makes reference to various process steps associated with fabrication of a device in a multi-step process. In particular, FIG. 2 makes reference to a first process step and a second process step. In this framing, the second process step may correspond to a current process step, where defects of interest are detected after this current process step is applied to the sample 104, and where the first process step may refer to any process step prior to the current process step. In some embodiments, the first and second process steps are sequentially performed. In some embodiments, one or more intermediate process steps may be performed between the first and second process steps. In this way, the terms first process step and second process step are used simply to indicate a relative order of operation, but do not otherwise limit the method 200. Further, the first and second process steps may be associated with any type of process step such as, but not limited to, deposition of process layers and/or photoresists, photoresist exposure with a desired pattern, etching of the photoresist and/or underlying process layers, polishing, or the like.

FIG. 2 also makes reference to various images. It is to be understood that such images may be images that are directly generated in one step by the inspection system 100, portions thereof, or composite images formed by stitching sub-images generated by the inspection system 100. Further, images may be cropped or otherwise modified as necessary. In this way, references to images herein are merely illustrative and not limiting on the types of images that may be generated by the inspection system 100.

In some embodiments, the method 200 includes a step 202 of generating first-step images of multiple sample regions 302 of a sample 104 after a first process step (e.g., a previous process step). The sample regions 302 may include any regions on the sample 104 that will be inspected for defects. For example, the sample regions 302 may include dies or portions of dies (e.g., cells). In some embodiments, the method 200 includes a step 204 of generating second-step images of the multiple sample regions 302 of the sample 104 after a second process step (e.g., a current process step).

For example, the steps 202 and 204 may include generating images of the same sample regions 302 (e.g., the same dies, cells, or the like) after two process steps (e.g., the first or previous process step and the second or current process step). The first and second process steps (e.g., the previous and current process steps) may correspond to any process steps such as, but not limited to, a lithography step or an etching step. Further, the second process step may modify the sample 104 in at least some of the sample regions 302.

The first-step images and the second-step images may be generated using any technique known in the art. For example, the first-step and second-step images may be, but are not required to be, associated with data from multiple swaths (or portions thereof) of a scanning imaging sub-system 102 after the associated process steps that are aligned and/or stitched (e.g., by the controller 132).

In some embodiments, the method 200 includes a step 206 of identifying one of the plurality of sample regions 302 as a test region and at least some of the remaining sample regions 302 as comparison regions, wherein the second-step image of the test region is a test image and the second-step images of the comparison regions are comparison images.

FIG. 3 is a simplified schematic of a portion of a sample 104 depicting a series of sample regions 302 that may be inspected for defects, in accordance with one or more embodiments of the present disclosure. In FIG. 3, one sample region 302' is identified as a test region, while the remaining are identified as comparison regions. In this way, a test region may correspond to one of the sample regions 302 to be inspected for defects at a particular time, whereas comparison regions may correspond to additional sample regions 302 with the same or similar design. In some embodiments, the comparison regions are used to generate a reference image. As described previously herein, any of the sample regions 302 may be identified as a test region in any iteration of the method 200 and further identified as a comparison region in another iteration of the method 200. In this way, the method 200 (or portions thereof) may be repeated to provide defect identification in multiple sample regions 302.

In some embodiments, the method 200 includes a step 208 of generating a multi-step difference image by a weighted subtraction of a combination of at least one of the second-step comparison images and at least two of the first-step images from the test image.

It is contemplated herein that the first-step images may include or may have data associated with noise or nuisance signals in the second-step images. For example, it may be the case that certain intensity variations in the second-step images may be associated with structures fabricated prior to the second process step. In some cases, certain intensity variations in the second-step images may be associated with out-of-focus features located outside of a depth of focus of the imaging sub-system 102. It is further contemplated herein that similar intensity variations may also be present in the first-step images. The degree to which intensity variations in the first-step and second-step images are related may depend on the impact of the second process step on the sample 104. In many fabrication processes, the second process step provides either locally isolated modification of the sample (e.g., etching of selected features, or the like) or uniform modification of the sample (e.g., deposition of one or more films, or the like).

Accordingly, subtracting first-step images from second-step images may beneficially remove common intensity variations that may be attributed to noise or nuisance signals, which may improve the SNR associated with DOIs.

In some embodiments, the method 200 includes a step 210 of identifying defects on the sample 104 associated with the second process step based on the multi-step difference image. Any suitable technique may be used to identify defects from the multi-step difference image. Further, any type of defect (or defects of different types) may be identified using the systems and methods disclosed herein. For example, a defect may include deviation of at least one of a shape, size, or orientation of a feature fabricated by the second process step. As another example, a defect may include the absence of a feature intended to be fabricated by the second process step. As another example, a defect may include at least one of a scratch, a pit, or residual material in the inspection region after the second process step. As another example, a defect may include at least one of an unintended bridge between two features fabricated by the second process step or an unintended break in a feature fabricated by the second process step.

In some embodiments, the step 210 includes identifying defects based on applying a threshold to the multi-step difference image. For example, pixel values greater than or equal to a selected threshold value may be characterized as a defect, whereas pixel values below the threshold may be characterized as a non-defect (e.g., background, nuisance, noise, or the like).

In some embodiments, the step 210 includes detecting defects with a machine learning technique, which may be unsupervised, supervised, or a combination thereof. For example, the multi-step difference image may be provided as an input to a supervised or unsupervised machine learning algorithm suitable for identifying defects. As an illustration, the machine learning algorithm may provide hard classifications of selected portions of the sample as nuisances or defects (in any number of defect classes) or soft classifications with probabilities that selected portions of the sample may be classified as nuisances or defects (in any number of defect classes). As another example, a supervised machine learning algorithm may be trained with multi-step difference images with known (e.g., labeled) defects. Such a trained machine learning algorithm may then be used during runtime to identify defects in new samples based on multi-step difference images of new samples (e.g., test samples). In some embodiments, the step 210 may include utilizing a multi-die auto threshold (MDAT) technique. MDAT techniques are generally described in U.S. Pat. Nos. 10,535,131; 10,395,358; 10,557,802; 10,801,968; 9,518,934; 11,120,546; 11,416,982; 11,494,924; 10,943,838; 9,613,411; 9,619,876; 10,599,944; 10,535,131; 11,551,348; 11,550,309; 9,518,934; 10,923,317; and U.S. Patent Publication Number 2021/0010945; all of which are incorporated herein by reference in their entireties. As an illustration, an MDAT technique may include a clustering analysis based on a two-dimensional point cloud generated based on the multi-step difference image and the test image.

In some cases, a defect identified in step 210 may include any combination of DOIs or nuisances. Accordingly, additional steps or techniques may be utilized in addition to or in combination with the method 200.

In some embodiments, the method 200 further includes a step of classifying at least some of the defects into one or more classes. For example, the classes may include, but are not limited to, different types of defects or defects with different impacts on device performance.

The step 208 of generating a multi-step difference function is now described in greater detail, in accordance with one or more embodiments of the present disclosure.

It is contemplated herein that merely subtracting first-step images from second-step images may not be sufficient to remove unwanted signals and increase the SNR of DOIs. Rather, it may be desirable to utilize multiple images associated with the current and previous process steps (e.g., multiple first-step and second-step images) in combination to increase the SNR of DOIs. Further, different combinations of the first-step and second-step images may be utilized to generate the multi-step difference image within the spirit and scope of the present disclosure.

In some embodiments, the multi-step difference image may be generated based on a combination of multiple images from both the current and previous steps. For example, the multi-step difference image may correspond to a weighted difference (e.g., a weighted subtraction) of images from multiple sample regions associated with the first and second process steps:

$$I_{MSDIFF,i} = I_{SecondStep,i} - \Sigma_{j \neq i} \alpha_j I_{SecondStep,j} - \Sigma_j \beta_j I_{FirstStep,j} \quad (1)$$

where indices i and j refer to sample locations (e.g., dies, cells, or the like), and where $\alpha_j$ and $\beta_j$ refer to weights for the associated images. Further, subscripts FirstStep and SecondStep refer to first-step images (e.g., generated in step 202) and second-step images (e.g., generated in step 204), respectively. In this configuration, the test region may correspond to sample region i such that the test image (e.g., identified in step 206) may correspond to the term $I_{SecondStep,i}$. The remaining sample regions may then be characterized as comparison regions such that the term $\Sigma_{j \neq i} \alpha_j I_{SecondStep,j}$ may refer to second-step images of the comparison regions or second-step comparison images.

In some embodiments, a number of first-step and second-step images used to generate the multi-step difference image are equal. For example, the value of j appears in both the term $\Sigma_{j \neq i} \alpha_j I_{SecondStep,j}$ associated with the second-step images of the comparison regions and the term $\Sigma_j \beta_j I_{FirstStep,j}$ associated with the first-step images. Further, since the test image $I_{SecondStep,i}$ is a second-step image, the number of second-step images (e.g., the number of images associated with the terms $I_{SecondStep,i}$ and $\Sigma_{j\neq i}\alpha_j I_{SecondStep,j}$ combined) is equal to the number of first-step images (e.g., the number of images associated with the term $\Sigma_j \beta_j I_{FirstStep,j}$). Put another way, the number of first-step images used to generate the multi-step difference image (e.g., the number of images associated with the term $\Sigma_j \beta_j I_{FirstStep,j}$) may be one greater than the number of the second-step comparison images used to generate the multi-step difference image.

The weights α and β may be determined using any suitable technique. In some embodiments, the weights are determined based on metrics associated with the sample 104 in the associated sample locations and/or image quality metrics associated with the associated images such as, but not limited to, exposure, contrast, or noise. In some embodiments, the weights are determined by an optimization technique. For example, the weights may be determined based on a fitting technique to minimize the pixel intensities in the multi-step difference image ($I_{MSDIFF}$). For example, the weights may be determined based on a regression technique to minimize the pixel intensities in the multi-step difference image ($I_{MSDIFF}$). As another example, the weights may be determined using a defect detection algorithm such as, but not limited to, a multi-color adaptive threshold (MCAT) technique. The MCAT technique is generally described in U.S. Pat. Nos. 11,270,430; 11,120,546; 11,416,982; 11,494,924; 10,801,968; and U.S. Patent Application Publication Number 2021/0010945; all of which are incorporated herein by reference in their entireties. As another example, the weights may be determined using a machine learning technique (e.g., an unsupervised and/or a supervised machine learning technique).

Equation (1) may be characterized and/or implemented (e.g., by the controller 132) in a variety of ways. In some embodiments, a multi-step difference image is generated in a single step based on Equation (1) using various images stored in memory (e.g., memory 136). In some embodiments, one or more intermediate images are generated. For example, the term $\Sigma_{j\neq i}\alpha_j I_{SecondStep,j}$ may correspond to a second-step reference image generated using images of additional sample regions (e.g., dies, cells, or the like) than the test region after the second process step. In this way, the term $I_{SecondStep,i} - \Sigma_{j\neq i}\alpha_j I_{SecondStep,j}$ may correspond to a second-step difference image. Further, the term $\Sigma_j \beta_j I_{FirstStep,j}$ may correspond to a first-step reference image generated using images of any suitable sample regions after the first process step.

It is contemplated herein this first-step reference image may optionally include an image of the test region after the first process step (e.g., $\Sigma_j \beta_j I_{FirstStep,j}$ including an instance where j=i) when identifying defects generated by the second process step since the first step is prior to the second step and the associated sample regions may be considered equivalent in this first process step. Additionally, in some embodiments, Equation (1) may be adjusted to provide for the generation of a first-step difference image in a manner similar to the second-step difference image. In this configuration, a first-step reference image may be generated based on various sample regions different than the test region (e.g., $I_{FirstStep,j}$ for j ≠i) and subtracted from a first-step image of the test region (e.g., $I_{FirstStep,i}$):

$$I_{MSDIFF,i} = I_{SecondStep,i} - \Sigma_{j\neq i}\alpha_j I_{SecondStep,j} - [I_{FirstStep,i} - \Sigma_{j\neq i}\beta_j I_{FirstStep,j}] \quad (2)$$

Further, additional weights may be applied to such difference images. For example, the multi-step difference image may be generated by:

$$I_{MSDIFF,i} = I_{SecondStep,i} - \Sigma_{j\neq i}\alpha_j I_{SecondStep,j} - \gamma[I_{FirstStep,i} - \Sigma_{j\neq i}\beta_j I_{FirstStep,j}], \quad (3)$$

where γ is an additional weight applied to the first-step reference image. In a general sense, the weight γ may be determined using any suitable technique including, but not limited to, the techniques disclosed above for determining weights α and/or β. In some embodiments, the weights α and β are determined separately and then the weight γ is determined. For example, the weights α and β may be determined in a first step (e.g., by an optimization technique) followed by an additional step of determining γ (e.g., by another optimization technique). It is contemplated herein that such an approach may be relatively simpler, more efficient, and/or utilize fewer computational resources than some other approaches. In some embodiments, the weights α, β, and γ are determined in a single step (e.g., a single optimization step).

Further, although not explicitly shown, an additional weight may be given to the term $I_{FirstStep,i}$ (e.g., the first-step image corresponding to the test region). More generally, any of the weights (e.g., α, β, γ, or the like) may have any value or any sign (e.g., positive or negative) for any region.

Additional variations of the multi-step difference image are now described.

In some embodiments, all of the sample regions 302 have a common design after both the first and second process steps. For example, the sample regions 302 may correspond to different die having the same design and thus ideally the same fabricated features. Accordingly, each of the sample regions 302 may be utilized as test regions or comparison regions (e.g., for the generation of reference images) as described above. Further, a multi-step difference images generated in this configuration may not include any intentionally-fabricated features.

In some embodiments, sample regions 302 other than the test region (e.g., sample regions 302 j≠i using the nomenclature of Equations (1)-(3) may have a common design as the test region (e.g., i) after the first process step but not after the second process step. For example, the second process step may generate features (e.g., vias, etch patterns, fabricated structures, or the like) in the test region (i) but not in the additional sample regions 302 j≠i. In this configuration, a multi-step difference image may include the fabricated features. Such a configuration may be suitable for, but is not limited to, comparing the fabricated features to design specification (e.g., to identify missing features, improperly-fabricated features, or the like).

Further, referring generally to Equations (1)-(3), the first-step images and the second-step images used to generate a multi-step difference image may generally be of the same or different sample regions 302.

Referring now to FIG. 4, a non-limiting example of the application of the method 200 is described. FIG. 4 is a flow diagram depicting simulated images of a sample 104 associated with various steps of the method 200, in accordance with one or more embodiments of the present disclosure. In particular, FIG. 4 includes a first-step difference image 402, a second-step difference image 404, and a multi-step difference image 406.

For example, the second-step difference image 404 may be generated based on a difference between a second-step test image of a sample region of interest (e.g., a test region) and a reference image after the second process step, where the second-step reference image may be generated based on one or more images of additional sample regions. Using the nomenclature from Equations (1)-(3), the second-step difference image 404 may be characterized as $I_{SecondStep,i} - \Sigma_{j \neq i} \alpha_j I_{SecondStep,j}$. In this simulation, the second-step difference image 404 includes a simulated defect 408 generated during the second process step that is buried within the noise in the image. For example, SNR of the second-step difference image 404 is 0.9 based on a signal amplitude of 121 and a noise amplitude of 134.

The first-step difference image 402 may similarly be generated based on a difference between a first-step test image of the test region and a first-step reference image, where the first-step reference image may be generated based on one or more images of additional sample regions. Again using the nomenclature from Equations (1)-(3), the first-step difference image 402 may be characterized as $I_{FirstStep,i} - \Sigma_{j \neq i} \beta_j I_{FirstStep,j}$. The first-step difference image 402 does not include the simulated defect 408 since this simulated defect 408 was generated in the subsequent second process step. Further, this simulated image has a noise level of N=103, which is lower than the noise level of the subsequent second-step difference image 404 (121), but retains a similar distribution. As described previously herein, the common distribution of noise in the first-step difference image 402 and the second-step difference image 404 (or between first-step and second-step images more generally) may be based on common physical structures on the sample 104 that may be observed using the inspection system 100.

The multi-step difference image 406 may then correspond to a difference between the second-step difference image 404 and the first-step difference image 402. Continuing with the nomenclature of Equations (1)-(3), this multi-step difference image 406 may thus be characterized by Equation (2): $I_{MSDIFF,i} = I_{SecondStep,i} - \Sigma_{j \neq i} \alpha_j I_{SecondStep,j} - [I_{FirstStep,i} - \Sigma_{j \neq i} \beta_j I_{FirstStep,j}]$. It is clearly observed that the multi-step difference image 406 exhibits substantially less noise than the second-step difference image 404 and thus a substantially greater SNR such that the simulated defect 408 is clearly observable. In particular, the multi-step difference image 406 has a noise amplitude of N=19.4 and a SNR of 6.2 compared to a noise amplitude of N=134 and a SNR of 0.9 for the second-step difference image 404.

The herein described subject matter sometimes illustrates different components contained within, or connected with, other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "connected" or "coupled" to each other to achieve the desired functionality, and any two components capable of being so associated can also be viewed as being "couplable" to each other to achieve the desired functionality. Specific examples of couplable include but are not limited to physically interactable and/or physically interacting components and/or wirelessly interactable and/or wirelessly interacting components and/or logically interactable and/or logically interacting components.

It is believed that the present disclosure and many of its attendant advantages will be understood by the foregoing description, and it will be apparent that various changes may be made in the form, construction, and arrangement of the components without departing from the disclosed subject matter or without sacrificing all of its material advantages. The form described is merely explanatory, and it is the intention of the following claims to encompass and include such changes. Furthermore, it is to be understood that the invention is defined by the appended claims.

What is claimed:

1. An inspection system comprising:
a controller including one or more processors configured to execute program instructions causing the one or more processors to implement an inspection recipe by:
receiving first-step images of a plurality of sample regions after a first process step;
receiving second-step images of the plurality of sample regions after a second process step, wherein the second process step modifies the sample in at least one of the plurality of sample regions;
identifying one of the plurality of sample regions as a test region and at least some of the remaining sample regions as comparison regions, wherein the second-step image of the test region is a test image and the second-step images of the comparison regions are second-step comparison images;
generating a multi-step difference image by a weighted subtraction of a combination of at least one of the second-step comparison images and at least two of the first-step images from the test image; and
identifying defects in the test region associated with the second process step based on the multi-step difference image.

2. The inspection system of claim 1, wherein a number of the first-step images used to generate the multi-step difference image is one greater than a number of the second-step comparison images to provide that the multi-step difference image is generated based on a same number of the first-step and the second-step images.

3. The inspection system of claim 2, wherein the number of first-step images used to generate the multi-step difference image is at least three.

4. The inspection system of claim 1, further comprising:
classifying at least some of the defects as at least one of a nuisance or a defect of interest.

5. The inspection system of claim 1, wherein weights associated with the weighted subtraction are determined by a fitting technique.

6. The inspection system of claim 1, wherein weights associated with the weighted subtraction are determined by a regression technique.

7. The inspection system of claim 1, wherein weights associated with the weighted subtraction are determined by a multi-color adaptive threshold (MCAT) technique.

8. The inspection system of claim 1, wherein weights associated with the weighted subtraction are determined by a machine learning technique.

9. The inspection system of claim 1, wherein generating the multi-step difference image by the weighted subtraction of the combination of at least one of the second-step comparison images and at least two of the first-step images from the test image comprises:
generating the multi-step difference image ($I_{MSDIFF,i}$) based on the equation $I_{MSDIFF,i} = I_{SecondStep,i} - \Sigma_{j \neq i} \alpha_j I_{SecondStep,j} - \Sigma_j \beta_j I_{FirstStep,j}$, wherein $I_{SecondStep,i}$ corresponds to the test image, $\Sigma_{j \neq i} \alpha_j I_{SecondStep,j}$ corresponds to the at least one of the second-step comparison images, and $\Sigma_j \beta_j I_{FirstStep,j}$ corresponds to the at least two of the first-step images, wherein subscripts i and j correspond to the sample regions, wherein α and β correspond to weights.

10. The inspection system of claim 1, wherein generating the multi-step difference image by the weighted subtraction of the combination of at least one of the second-step comparison images and at least two of the first-step images from the test image comprises:
generating the multi-step difference image ($I_{MSDIFF,i}$) based on the equation $I_{MSDIFF,i} = I_{SecondStep,i} - \Sigma_{j \neq i} \alpha_j I_{SecondStep,j} - [I_{FirstStep,i} - \Sigma_{j \neq i} \beta_j I_{FirstStep,j}]$, where $I_{SecondStep,i}$ corresponds to the test image, $\Sigma_{j \neq i} \alpha_j I_{SecondStep,j}$ corresponds to the at least one of the second-step comparison images, and $[I_{FirstStep,i} - \Sigma_{j \neq i} \beta_j I_{FirstStep,j}]$ corresponds to the at least one of the first-step images, wherein subscripts i and j correspond to the sample regions, wherein α, β, and γ correspond to weights.

11. The inspection system of claim 1, wherein generating the multi-step difference image by the weighted subtraction of the combination of at least one of the second-step comparison images and at least two of the first-step images from the test image comprises:
generating the multi-step difference image ($I_{MSDIFF,i}$) based on the equation $I_{MSDIFF,i} = I_{SecondStep,i} - \Sigma_{j \neq i} \alpha_j I_{SecondStep,j} - \gamma [I_{FirstStep,i} - \Sigma_{j \neq i} \beta_j I_{FirstStep,j}]$, where $I_{SecondStep,i}$ corresponds to the test image, $\Sigma_{j \neq i} \alpha_j I_{SecondStep,j}$ corresponds to the at least one of the second-step comparison images, and $[I_{FirstStep,i} - \Sigma_{j \neq i} \beta_j I_{FirstStep,j}]$ corresponds to the at least one of the first-step images, wherein subscripts i and j correspond to the sample regions, wherein α, β, and γ correspond to weights.

12. The inspection system of claim 1, wherein detecting defects on the sample based on the multi-step difference image comprises:
providing the inspection reference image to a machine learning algorithm; and
detecting defects on the sample based on an output of the machine learning algorithm.

13. The inspection system of claim 1, wherein detecting defects on the sample based on the multi-step difference image comprises:
detecting defects on the sample based on the multi-step difference image using a multi-die adaptive threshold (MDAT) technique.

14. The inspection system of claim 1, wherein the defects comprise:
a deviation of at least one of a shape, size, or orientation of a feature fabricated by the second process step.

15. The inspection system of claim 1, wherein the defects comprise:
an absence of a feature intended to be fabricated by the second process step.

16. The inspection system of claim 1, wherein the defects comprise:
at least one of a scratch, a pit, or residual material in the inspection region after the second process step.

17. The inspection system of claim 1, wherein the defects comprise:
at least one of an unintended bridge between two features fabricated by the second process step or an unintended break in a feature fabricated by the second process step.

18. An inspection method comprising:
generating first-step images of a plurality of sample regions after a first process step;
generating second-step images of the plurality of sample regions after a second process step, wherein the second process step modifies the sample in at least one of the plurality of sample regions;
identifying one of the plurality of sample regions as a test region and at least some of the remaining sample regions as comparison regions, wherein the second-step image of the test region is a test image and the second-step images of the comparison regions are comparison images;
generating a multi-step difference image by a weighted subtraction of a combination of at least one of the second-step comparison images and at least two of the first-step images from the test image; and
identifying defects in the test region associated with the second process step based on the multi-step difference image.

19. The inspection method of claim 18, wherein a number of the first-step images used to generate the multi-step difference image is one greater than a number of the second-step comparison images to provide that the multi-step difference image is generated based on a same number of the first-step and the second-step images.

20. The inspection method of claim 19, wherein the number of first-step images used to generate the multi-step difference image is at least three.

21. The inspection method of claim 18, further comprising:
classifying at least some of the defects as at least one of a nuisance or a defect of interest.

22. The inspection method of claim 18, wherein weights associated with the weighted subtraction are determined by a fitting technique.

23. The inspection method of claim 18, wherein weights associated with the weighted subtraction are determined by a regression technique.

24. The inspection method of claim 18, wherein weights associated with the weighted subtraction are determined by a multi-color adaptive threshold (MCAT) technique.

25. The inspection method of claim 18, wherein weights associated with the weighted subtraction are determined by a machine learning technique.

26. The inspection method of claim 18, wherein generating the multi-step difference image by the weighted subtraction of the combination of at least one of the second-step comparison images and at least two of the first-step images from the test image comprises:
generating the multi-step difference image ($I_{MSDIFF,i}$) based on the equation $I_{MSDIFF,i} = I_{SecondStep,i} - \Sigma_{j \neq i} \alpha_j I_{SecondStep,j} - \Sigma_j \beta_j I_{FirstStep,j}$, wherein $I_{SecondStep,i}$ corresponds to the test image, $\Sigma_{j \neq i} \alpha_j I_{SecondStep,j}$ corresponds to the at least one of the second-step comparison images, and $\Sigma_{j \neq i} \alpha_j I_{FirstStep,j}$ corresponds to the at least two of the first-step images, wherein subscripts i and j correspond to the sample regions, wherein α and β correspond to weights.

27. The inspection method of claim 18, wherein generating the multi-step difference image by the weighted subtraction of the combination of at least one of the second-step comparison images and at least two of the first-step images from the test image comprises:
generating the multi-step difference image ($I_{MSDIFF,i}$) based on the equation $I_{MSDIFF,i} = I_{SecondStep,i} - \Sigma_{j \neq i} \alpha_j I_{SecondStep,j} - [I_{FirstStep,i} - \Sigma_{j \neq i} \beta_j I_{FirstStep,j}]$, where $I_{SecondStep,i}$ corresponds to the test image, $\Sigma_{j\neq i}\alpha_j I_{SecondStep,j}$ corresponds to the at least one of the second-step comparison images, and $[I_{FirstStep,i}-\Sigma_{j\neq i}\beta_j I_{FirstStep,j}]$ corresponds to the at least one of the first-step images, wherein subscripts i and j correspond to the sample regions, wherein $\alpha$ and $\beta$ correspond to weights.

28. The inspection method of claim 18, wherein generating the multi-step difference image by the weighted subtraction of the combination of at least one of the second-step comparison images and at least two of the first-step images from the test image comprises:

generating the multi-step difference image ($I_{MSDIFF,i}$) based on the equation $I_{MSDIFF,i}=I_{SecondStep,i}-\Sigma_{j\neq i}\alpha_j I_{SecondStep,j}-\gamma[I_{FirstStep,i}-\Sigma_{j\neq i}\beta_j I_{FirstStep,j}]$, where $I_{SecondStep,i}$ corresponds to the test image, $\Sigma_{j\neq i}\alpha_j I_{SecondStep,j}$ corresponds to the at least one of the second-step comparison images, and $[I_{FirstStep,i}-\Sigma_{j\neq i}\beta_j I_{FirstStep,j}]$ corresponds to the at least one of the first-step images, wherein subscripts i and j correspond to the sample regions, wherein $\alpha$, $\beta$, and $\gamma$ correspond to weights.

29. The inspection method of claim 18, wherein detecting defects on the sample based on the multi-step difference image comprises:

providing the inspection reference image to a machine learning algorithm; and detecting defects on the sample based on an output of the machine learning algorithm.

30. The inspection method of claim 18, wherein detecting defects on the sample based on the multi-step difference image comprises:

detecting defects on the sample based on the multi-step difference image using a multi-die adaptive threshold (MDAT) technique.

31. The inspection method of claim 18, wherein the defects comprise:

a deviation of at least one of a shape, size, or orientation of a feature fabricated by the second process step.

32. The inspection method of claim 18, wherein the defects comprise:

an absence of a feature intended to be fabricated by the second process step.

33. The inspection method of claim 18, wherein the defects comprise:

at least one of a scratch, a pit, or residual material in the inspection region after the second process step.

34. The inspection method of claim 18, wherein the defects comprise:

at least one of an unintended bridge between two features fabricated by the second process step or an unintended break in a feature fabricated by the second process step.

35. An inspection system comprising:

an imaging sub-system including an illumination source and a detector configured to image a sample; and a controller communicatively coupled to the imaging sub-system, the controller including one or more processors configured to execute program instructions causing the one or more processors to implement an inspection recipe by:

receiving first-step images of a plurality of sample regions after a first process step from the imaging sub-system;

receiving second-step images of the plurality of sample regions after a second process step, wherein the second process step modifies the sample in at least one of the plurality of sample regions from the imaging sub-system;

identifying one of the plurality of sample regions as a test region and at least some of the remaining sample regions as comparison regions, wherein the second-step image of the test region is a test image and the second-step images of the comparison regions are comparison images;

generating a multi-step difference image by a weighted subtraction of a combination of at least one of the second-step comparison images and at least two of the first-step images from the test image; and identifying defects in the test region associated with the second process step based on the multi-step difference image.

36. The inspection system of claim 35, wherein a number of the first-step images used to generate the multi-step difference image is one greater than a number of the second-step comparison images to provide that the multi-step difference image is generated based on a same number of the first-step and the second-step images.

37. The inspection system of claim 35, wherein the imaging sub-system comprises:

a bright-field imaging sub-system.

38. The inspection system of claim 35, wherein the imaging sub-system comprises:

a dark-field imaging sub-system.

* * * * *